United States Patent [19]

Levitt

[11] Patent Number: 5,379,303

[45] Date of Patent: Jan. 3, 1995

[54] MAXIMIZING IMPROVEMENT TO FAULT COVERAGE OF SYSTEM LOGIC OF AN INTEGRATED CIRCUIT WITH EMBEDDED MEMORY ARRAYS

[75] Inventor: Marc E. Levitt, Sunnyvale, Calif.

[73] Assignee: Sun Microsystems, Inc., Mountain View, Calif.

[21] Appl. No.: 717,615

[22] Filed: Jun. 19, 1991

[51] Int. Cl.$^6$ ............................................. G01R 31/28
[52] U.S. Cl. ........................................ 371/27; 371/22.5
[58] Field of Search ................... 371/27, 22.1, 22.5, 371/26

[56] References Cited

U.S. PATENT DOCUMENTS

| | | | |
|---|---|---|---|
| 4,204,633 | 5/1980 | Goel | 371/27 |
| 4,481,627 | 11/1984 | Beauchesne et al. | 371/21 |
| 4,716,564 | 12/1987 | Hung et al. | 371/27 |
| 4,726,023 | 2/1988 | Carter et al. | 371/15 |
| 4,791,578 | 12/1988 | Fazio et al. | 371/23 |
| 4,801,870 | 1/1989 | Eichelberger et al. | 371/25.1 |
| 4,841,485 | 6/1989 | Prilik et al. | |
| 4,969,148 | 11/1990 | Nadeau-Dostie et al. | 371/21.1 |
| 5,144,230 | 9/1992 | Katoozi et al. | 371/22.6 |
| 5,206,862 | 6/1993 | Chandra et al. | 371/27 |
| 5,230,001 | 7/1993 | Chandra et al. | 371/27 |
| 5,257,268 | 10/1993 | Agrawal et al. | 371/27 |

FOREIGN PATENT DOCUMENTS 151775  7/1987  Japan ................ G01R 31/28

OTHER PUBLICATIONS

W. O. Budde "Modular Test Processor for VLSI chips and High-density PC Boards" pp. 1118-1124 1988 IEEE.

H. C. Ritter et al. 'Modular BFST concept for Microprocessors' 1990 IEEE pp. 234–237.

Primary Examiner—Charles E. Atkinson
Assistant Examiner—Albert Decady
Attorney, Agent, or Firm—Blakely Sokoloff Taylor & Zafman

[57] ABSTRACT

Two related methods and apparatus for determining a binary constant to be output from embedded memory arrays into system logic of an integrated circuit when the system logic is being tested, that maximizes improvement to fault coverage of the system logic, are disclosed. The present invention has particular application to digital system testing. The fault coverage of the system logic is improved due to its controllability and observability are indirectly enhanced by the enhanced controllability of the embedded memory arrays. The first related method and apparatus determines the binary constant based on a testability measure selected for the system logic. The second related method and apparatus determines the binary constant based on results from automated test patterns generation for the integrated circuit. Both methods and apparatus provide a constant that is more effective than a randomly assigned binary constant, but without the expensive computations required for a binary constant determined from all possible enumeration.

26 Claims, 8 Drawing Sheets

MAXIMIZING IMPROVEMENT TO FAULT COVERAGE OF SYSTEM LOGIC OF AN INTEGRATED CIRCUIT WITH EMBEDDED MEMORY ARRAYS

BACKGROUND OF THE INVENTION

1. Field of the Invention

The present invention is related to the field of integrated circuits. More particularly, the present invention is two related methods and apparatus for determining a binary constant to be output from embedded memory arrays into system logic of an integrated circuit, that maximizes improvement to fault coverage of the system logic.

2. Art Background

In the co-pending U.S. patent application, Ser. No. 07/717,890, filed Jun. 19, 1991, invented by the inventor of the present invention, Marc E. Levitt, assigned to the assignee of the present Application, Sun Microsystems Inc., entitled *Method and Apparatus for Improving Fault Coverage of System Logic of an Integrated Circuit with Embedded Memory Arrays*, a method and apparatus for improving fault coverage of system logic of an integrated circuit with embedded memory arrays by indirectly enhancing the controllability and observability of the system logic through enhancement to the controllability of the embedded memory arrays is disclosed. The method and apparatus disclosed in the co-pending application has particular application to digital system testing and integrated circuit design.

Fault coverage is the ratio between the number of faults detectable and the total number of faults in the assumed fault universe. Controllability is the ability to establish a specific signal at each node in a circuit by setting values on the circuit's input. Observability is the ability to determine the signal value at any node in a circuit by controlling the circuit's input and observing its outputs. For further description on controllability and observability, see M. Abramovici, M. Breuer, and A. Friedman, *Digital System Testing and Testable Design*, Computer Science Press, 1990, pp. 345-346.

The method and apparatus disclosed differ from the prior art in that the controllability of the embedded memory arrays is enhanced. As a result, the controllability and observability of the system logic is in turn enhanced, thereby improving the fault coverage of system logic of an integrated circuit with embedded memory. The method and apparatus of the co-pending application modify the embedded memory arrays 14 such that their outputs into the system logic 12 are unaltered during a normal mode of operation (TE=0), and altered to a predetermined binary constant (C) during a test mode of operation (TE=1) when the system logic 12 is being tested, whereby causing controllability of the embedded memory arrays 14 to be enhanced (FIG. 1).

Due to the variety of integrated circuits with embedded memory arrays, various approaches to modifying the embedded memory arrays are disclosed in the co-pending Application. The embedded memory arrays 14 may be modified using multiplexor-based, gate-based or transistor-based binary constant generation/selection circuit 16 (FIG. 1). Alternatively, output latches or sense amplifiers of the embedded memory arrays may be modified to output the predetermined binary constant (C) during the test mode of operation (TE=1).

One intuitively obvious approach to determining the binary constant to be output during the test mode of operation is to generate the binary constant randomly. However, a randomly generated binary constant may not be the most effective binary constant to be used. In fact, empirical evidence has shown that a predetermined binary constant customized for a particular integrated circuit further improves the effectiveness of the method and apparatus for improving fault coverage of system logic of an integrated circuit with embedded memory arrays disclosed in the co-pending Application.

At the other end of the spectrum, another intuitively obvious approach to determining the binary constant to be output during the test mode of operation is performing fault simulation for all possible binary constants and selecting the binary constant with the highest fault coverage. The fault simulation may be performed using a collection of test vectors generated by an automated test generation apparatus under the assumption that output from the embedded memory arrays is uncontrollable.

Fault simulation is the process of stimulating a circuit in the presence of a fault. Test patterns generation is the process of determining the stimuli necessary to cause certain faults in a circuit to be observed. For further description of fault simulation and test generation, see M. Abramovici, M. Breuer, and A. Friedman, *Digital System Testing and Testable Design*, Computer Science Press, 1990, pp. 131-342.

While the fault simulation and test patterns generation approach will yield the most effective binary constant to be used, it is computationally expensive if there are more than a handful of possible binary constants. $2^n$ fault simulation runs of m test vectors will be required, if there are m test vectors generated and n bits are output from the embedded memory arrays into the system logic. That is, for 100 test vectors and 5 bits of output from an embedded memory arrays into the system logic, 32 ($2^5$) fault simulation runs of 100 test vectors are required.

As will be described, the present invention complements the method and apparatus of the co-pending Application, and provides two related methods and apparatus for determining a binary constant to be output from an embedded memory arrays into system logics of an integrated circuit, that maximizes improvement to fault coverage of system logic. The two related methods and apparatus improve the effectiveness of the method and apparatus of the co-pending Application over the random assignment approach, and without requiring the expensive computations of the exhaustive fault simulation of generated test patterns approach.

SUMMARY OF THE INVENTION

Two related methods and apparatus for maximizing improvement to fault coverage of system logic of an integrated circuit with embedded memory arrays are disclosed which have particular application to digital system testing. Both methods and apparatus derive a binary constant for the embedded memory arrays to output into the system logic during a test mode of operation when the system logic is tested that maximizes the improvement to fault coverage of the system logic as a result of indirectly enhancing the controllability and observability of the system logic, by enhancing the controllability of the embedded memory arrays through constant output. The first related method and apparatus derives the binary constant by maximizing a testability measure selected for the system logic. The second related method and apparatus derives the binary constant based on results of test patterns generation for the integrated circuit.

The first related method and apparatus derives the bit settings of the binary constant, one bit at a time, based on the marginal contributions toward maximizing the testability measure selected for the system logic. The testability measure selected for the system logic is the inverse of the total number of uncontrollable or unobservable nets in the system logic.

The second related method and apparatus derives the bit settings of the binary constant based on the assigned outputs from the embedded memory arrays for the test patterns generated. The test patterns are generated using a modified automated test pattern generation. The bit settings of the binary constant are set to equal the assigned outputs from the embedded memory arrays if they are equal, or else they are set to equal a composite output reduced heuristically from the assigned outputs.

NOTATIONS AND NOMENCLATURE

Figure 1:
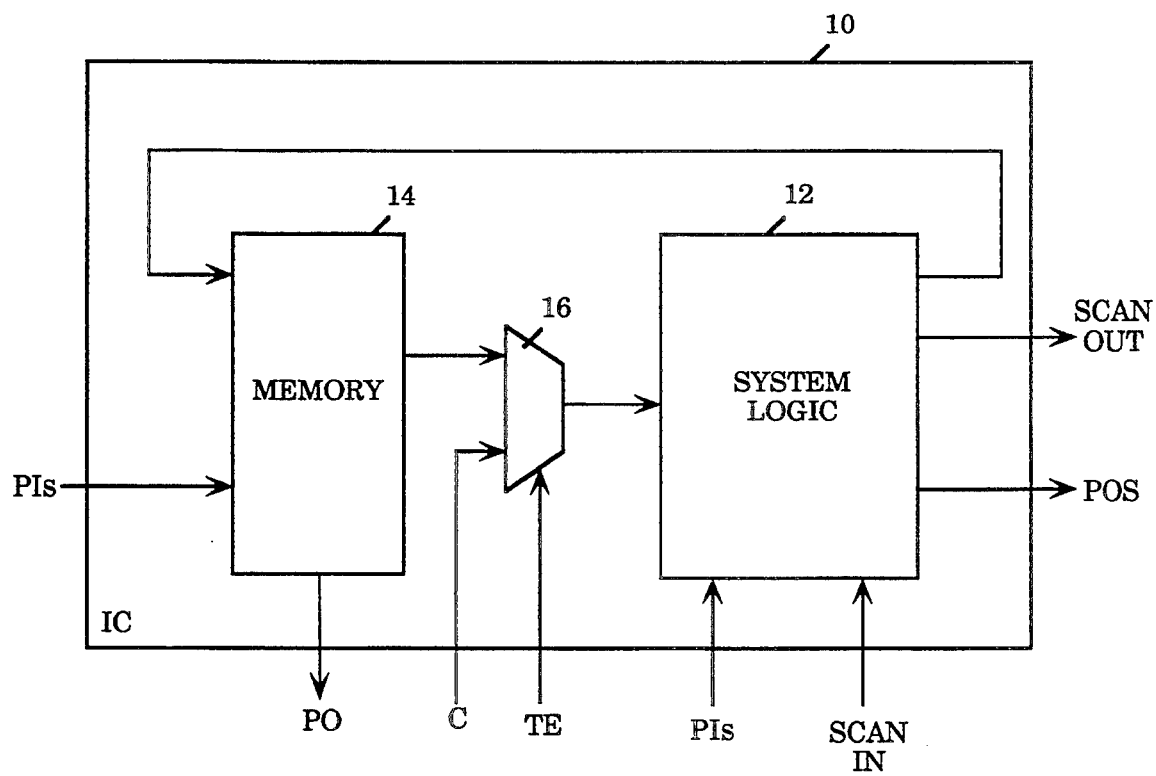
FIG. 1 shows a block diagram illustrating the method and apparatus of the co-pending Application for improving fault coverage of system logic of an integrated circuit with embedded memory arrays.

The detailed description which follows is presented largely in terms of program procedures executed by a computer. These procedural descriptions and representations are the means used by those skilled in the arts to most effectively convey the substance of their work to others skilled in the art.

A procedure is here, and generally, conceived to be a self-consistent sequence of steps leading to a desired result. These steps are those that require physical manipulations of physical quantities. Usually, though not necessarily, these quantities take the form of electrical or magnetic signals capable of being stored, transferred, combined, compared, and otherwise manipulated. It proves convenient at times, principally for reasons of common usage, to refer to these signals as bits, values, elements, symbols, objects, characters, terms, numbers, or the like. It should be borne in mind, however, that all these and similar terms are to be associated with the appropriate physical quantities and are merely convenient labels applied to these quantities.

Further, the manipulations performed are often referred to in terms, such as adding or comparing, which are commonly associated with mental operations performed by a human operator. No such capability of a human operator is necessary, or desirable in most cases, in any of the operation described herein which form part of the present invention; the operations are machine operations. In all cases, it should be borne in mind the distinction between the method operations in operating a computer and the method of computation itself. The present invention relates to method steps for operating a computer in processing electrical or other physical signals to generate other desired physical signals.

The procedures presented herein are not entirely related to any particular computer or other apparatus. In particular, various general purpose machines may be used with procedures written in accordance with the teaching herein, or it may prove more convenient to construct more specialized apparatus to perform the required method steps. The required structure for a variety of these machines will be apparent from the description given below.

The present invention also relates to apparatus for performing these operations. This apparatus may be specially constructed for the required purposes or it may comprise a general purpose computer as selectively activated or re-configured by a computer program stored in the computer. The procedures presented herein are not entirely related to any particular computer or other apparatus. In particular, various general purpose machines may be used with procedures written in accordance with the teaching herein, or it may prove more convenient to construct more specialized apparatus to preform the required method steps. The required structure for a variety of these machines will appear from the description given below.

DETAILED DESCRIPTION OF THE INVENTION

Two related methods and apparatus for deriving a binary constant to be output from embedded memory arrays into system logic of an integrated circuit that maximizes improvement to fault coverage of system logic are disclosed. The two related methods and apparatus have particular application to digital system testing. In the following description for purposes of explanation, specific numbers, materials and configurations are set forth in order to provide a thorough understanding of the present invention. However, it will be apparent to one skilled in the art that the present invention may be practiced without the specific details. In other instances, well known systems are shown in diagrammatical or block diagram form in order not to obscure the present invention unnecessarily.

Figure 2A:
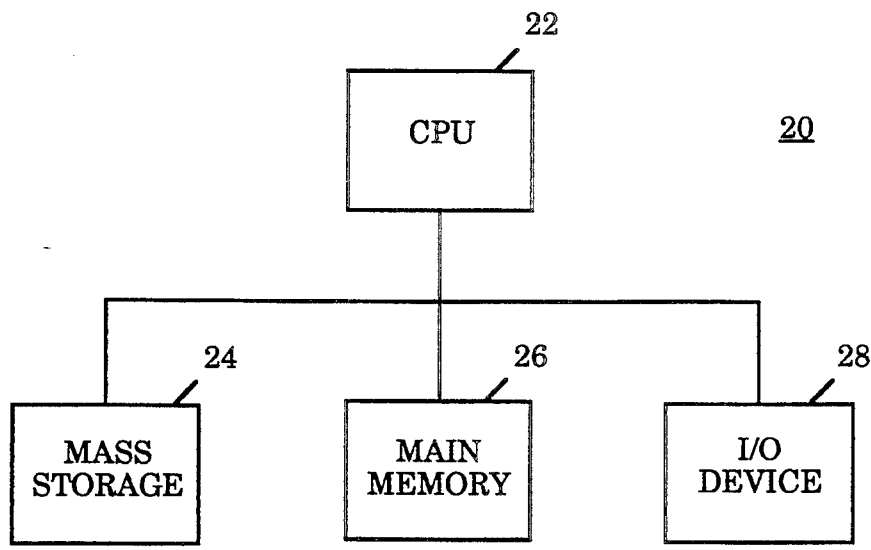
FIGS. 2a and 2b show block diagrams illustrating a physical view of the hardware elements and a logical view of the software elements of the computer system used by the present invention.
Figure 2B:
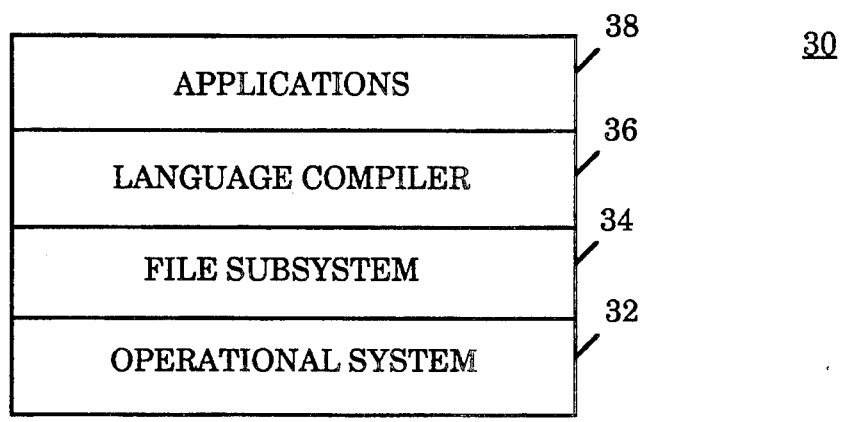

Referring now to FIGS. 2a and 2b, two block diagrams illustrating a physical view of the hardware elements and a logical view of the software elements of the computer system used by the present invention are shown. The computer system 20 comprises a central processing unit (CPU) 22, a memory unit 24, a mass storage unit 26 and an input/output (I/O) device 28. These hardware elements are those typically found in most general purpose computer systems and almost all special purpose computer systems. In fact, the several hardware elements contained within the computer system 20 are intended to be representative of this broad category of data processing systems. Particular examples of suitable data processing systems to fill the role of the computer system 20 include computer systems manufactured by Sun Microsystems, Inc., Mountain View, Calif. Other computer systems having like capabilities may of course be adapted in a straight forward manner to perform the functions described below.

The system software 30 comprises an operating system 32, a file system 34, and at least one language compiler 36. The applications 38 executing on the computer system utilize the underlying system services offered by system software 32–36. These software elements are those typically found in most general purpose computer systems and almost all special purpose computer systems. In fact, the several software elements contained within each of the computer system are intended to be representative of this broad category of system software. Particular examples of suitable system software to fill the role of these system software 30 of the computer system used by the present invention include the UNIX operating system, its file system and its Shell command language (UNIX is a registered trademark of AT&T). Other system software having like capabilities may of course be adapted in a straight forward manner to perform the functions described below.

Figure 3A:
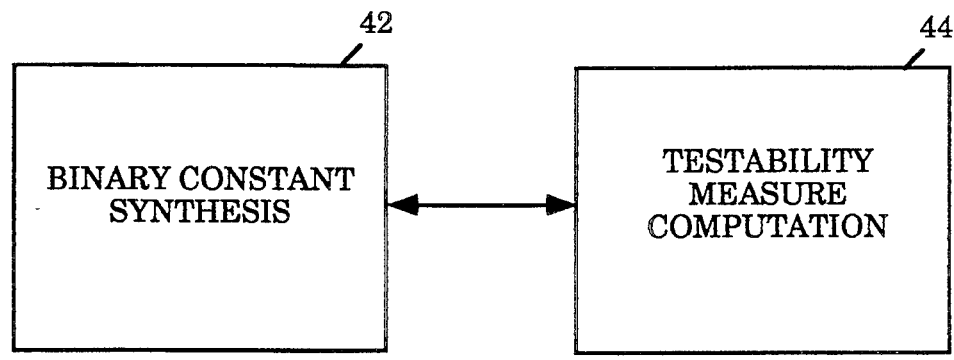
FIGS. 3a and 3b show block diagrams illustrating the preferred embodiment of the first and second complimentary apparatus of the present invention.
Figure 3B:
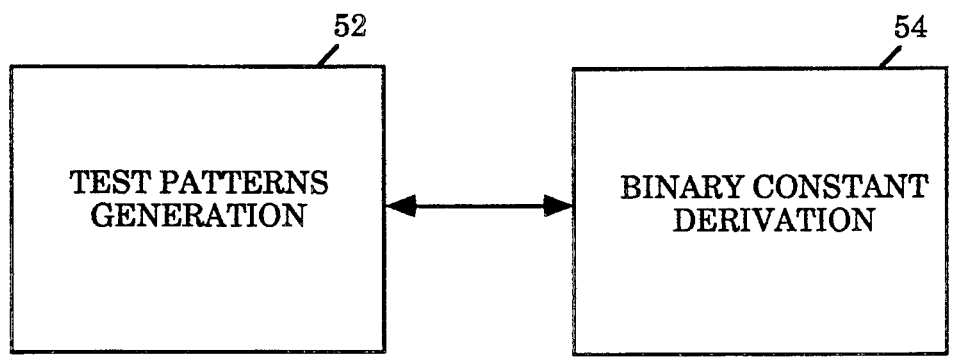

Referring now to FIG. 3a and 3b, two block diagrams illustrating the preferred embodiment of the first and second related apparatus of the present invention are shown. Referring first to FIG. 3a, the first related apparatus 40 comprises a binary constant synthesis procedure 42 and a testability measure computation procedure 44 invoked by the binary constant synthesis procedure 42.

The binary constant synthesis procedure 42 is for synthesizing various bit settings for the binary constant, calling the testability measure computation procedure 44 to compute the corresponding testability measures for the system logic for the various synthesized bit settings, and selecting the bit setting for the binary constant that maximizes the testability measures of the system logic. The testability measure computation procedure 44 is for computing the testability measure of the system logic for each bit setting of the binary constant provided and providing the computed testability measure to the binary constant synthesis procedure 42.

The binary constant synthesis procedure 42 and the testability measure computation procedure 44 are executed on the computer system described earlier. These program procedures 42 and 44 may be implemented in any programming language suggested by the executing computer system. The operational flow of these program procedures 42 and 44 will be described in further detail later in conjunction with the first related method of the present invention.

The testability measure used for the system logic may be implemented in a variety of manners. Preferably, the testability measure used is the inverse of the total number of uncontrollable and unobservable nets of the system logic. The uncontrollable and unobservable nets may be determined by any of the well known controllability/observability measures, for examples, those measures provided by Sandia Controllability/Observability Analysis Program (SCOAP) and those measures provided by Computer-Aided Measure for Logic Testability (CAMELOT). Computation of the testability measure will be described in further detail later, in conjunction with the first related method of the present invention. For further descriptions on SCOAP, see L. H. Goldstein and E. L. Thigen, *SCOAP: Sandia Controllability/Observability Analysis Program*, Proceedings 17th Design Automation Conference, pp.190–196, June 1980; and for further descriptions on CAMELOT, see R. G. Bennets, C. M. Maunder, and G. D. Robinson, *CAMELOT: A Computer-Aided Measure for Logic Testability*, IEE Proceedings, Vol 128, Part E, No. 5, pp. 177–189, 1981.

Referring now to FIG. 3b, the second related apparatus 50 comprises a test pattern generation procedure 52 and a binary constant deviation procedure 54 invoked by the test pattern generation procedure 52.

The test patterns generation procedure 52 is for automatically generating test patterns for the integrated circuit, collecting the assigned outputs from the embedded memory arrays for the generated test patterns and providing the assigned outputs to the binary constant deviation procedure 54. The binary constant deviation procedure 54 is for devising the binary constant based on the assigned outputs provided.

The test patterns generation procedure 52 and the binary constant derivation procedure 54 are also executed on the computer system described earlier. The test pattern generation procedure 52 may be implemented with any of the well known automated test patterns generation (ATPG) tools, modified as described below, for example, AIDA by Teradyne EDA, Inc., Santa Clara, Calif. For further description of AIDA, see *AIDA Automatic Test Pattern Generator Reference Manual*, Version 3.0, Teradyne EDA, Inc., 1989. The binary constant derivation procedure 54 may be implemented in any programming language supported by the executing computer system. The operational flow of these program procedures 42 and 44 will be described in further detail below, in conjunction with the second related method of the present invention.

Figure 4A:
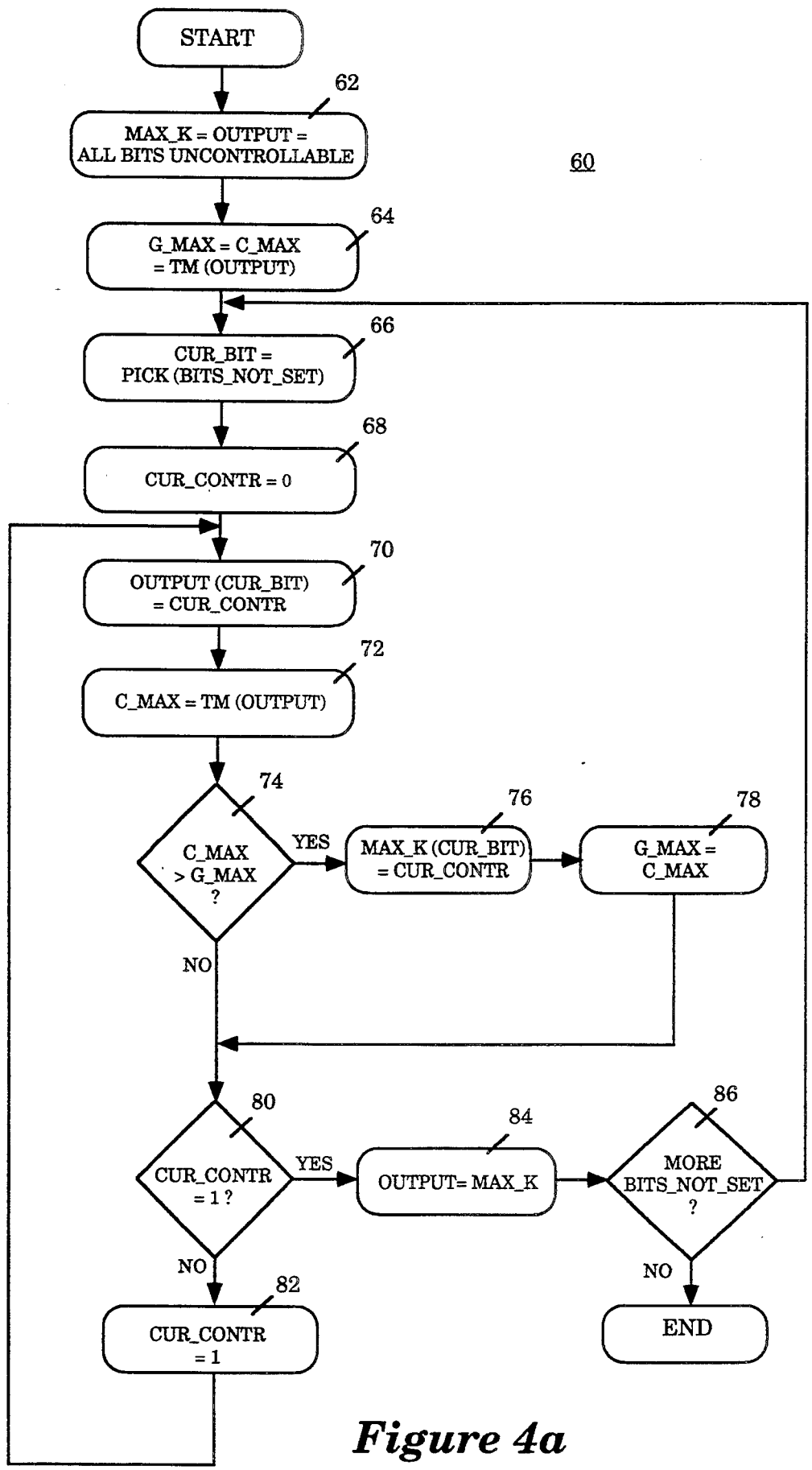
FIGS. 4a and 4b show block diagrams illustrating the first complementary method of the present invention for maximizing fault coverage of system logic of an integrated circuit with embedded memory based on a testability measure computed for the system logic.
Figure 4B:
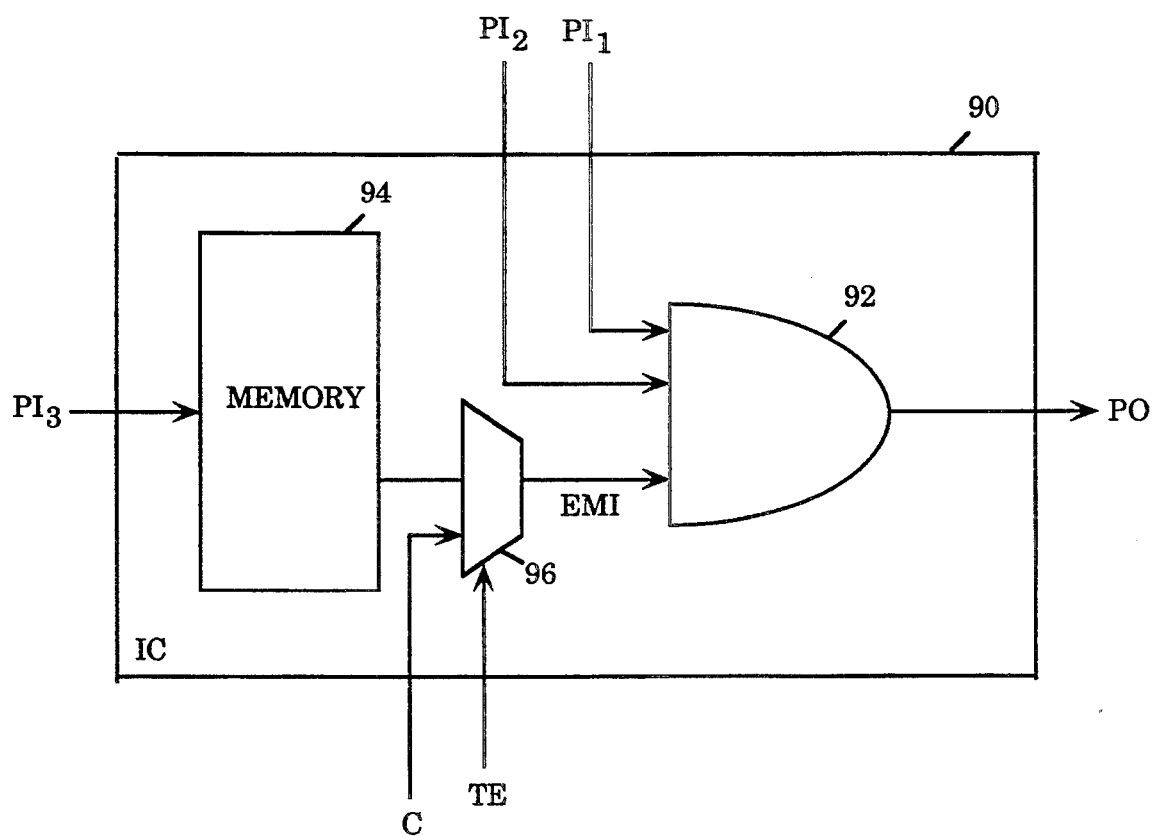

Referring now to FIGS. 4a and 4b, two block diagrams illustrating the first related method of the present invention is shown. Referring first to FIG. 4a, the first related method 60 comprises a plurality of steps to derive a binary constant for the embedded memory arrays to output into the system logic during a test mode of operation when the system logic is being tested that maximizes a testability measure selected for the system logic.

The first related method 60 comprises a plurality of initializing steps 62, 64 and a plurality of bit setting determining steps 66–84 repeated for each bit of the binary constant. Initially, the output of the embedded memory arrays (OUTPUT) is set to be uncontrollable and the binary constant (MAX_K) is set to be equal to the output of the embedded memory arrays (OUTPUT) 62. A global maximum (G_MAX) and a current maximum (C_MAX) of the testability measure selected for the system logic are set to the testability measure for the system logic computed with the current setting of the output of the embedded memory arrays (OUTPUT) 64.

Then, a bit (CUR_BIT) among the bits of the binary constant that have not been set (BITS_NOT_SET) is picked 66. A 0-bit setting is first considered for the current bit (CUR_BIT) of the binary constant (MAX_K) 68–78. A current controllability (CUR_CONTR) is set to zero 68 and the corresponding bit in the output of the embedded memory arrays (OUTPUT) is reset to be equal to the current controllability (CUR_CONTR) 70. The current maximum of the testability measure for the system logic (C_MAX) is reset to be equal to the testability measure for the system logic recomputed using the reset current output of the embedded memory arrays (OUTPUT) 72. The recomputed current maximum of the testability measure for the system logic (C_MAX) is compared against the global maximum of the testability measure for the system logic (G_MAX) to determine if it is greater 74.

If the recomputed current maximum of the testability measure for the system logic (C_MAX) is greater than the global maximum of the testability measure for the system logic (G_MAX), the current bit (CUR_BIT) of the binary constant (MAX_K) is set to be equal to the current controllability (CUR_CONTR) 76, i.e. zero. Additionally, the global maximum of the testability measure for the system logic (G_MAX) is reset to be equal to the recomputed current maximum of the testability measure for the system logic (C_MAX) 78.

Then, a 1-bit setting is considered for the current bit (CUR_BIT) of the fault coverage maximizing binary constant (MAX_K) 82, 70–78. The current controllability (CUR_CONTR) is reset to one 82. The steps for resetting the output of the embedded memory arrays (OUTPUT) 70, resetting the current maximum of the testability measure for the system logic (C_MAX) 72, conditionally resetting the current bit (CUR_BIT) of the binary constant (MAX_K) 76 and conditionally resetting the global maximum of the testability measure for the system logic (G_MAX) 78 are repeated as previously described. Lastly, the output of the embedded memory arrays (OUTPUT) is reset to be equal to the binary constant (MAX_K) 84.

The bit setting determining steps 66–84 are repeated for each bit of the binary constant (MAX_K) as previously described, until all bits of the binary constant (MAX_K) have been set.

For an embedded memory that outputs n bits, the number of testability measure computations required is 2n, as compared to $2^n$ fault simulations of m test vectors if all possible binary constants are evaluated. The computational savings over the intuitive approach of evaluating all possible binary constants increase exponentially as n increases.

Referring now to FIG. 4b, a block diagram illustrating an exemplary integrated circuit with a single AND gate and embedded memory arrays is shown. The first related method of the present invention is further illustrated with reference to this exemplary integrated circuit 90, where $$PO = PI_1 \cdot PI_2 \cdot EMI.$$

First, let
CC0(N) be combinational 0-controllability of net N
CC1(N) be combinational 1-controllability of net N
CO(N) be combinational observability of net N Second, assuming SCOAP like measures are used to measure controllability and observability, so whenever
(1) $CC0(N) = \infty$, then net N stuck-at-0 is undetectable,
(2) $CC1(N) = \infty$, then net N stuck-at-1 is undetectable,
(3) $CO(N) = \infty$, then all faults that must pass through net N are undetectable.

Now, applying the SCOAP like measures to the exemplary integrated circuit 90
CC0(PO)=Min[CC0(PI$_1$), (CC0(PI$_2$), CC0(EMI)]
CC1(PO)=CC1(PI$_1$)+CC1(PI$_2$)+CC1(EMI)
CO(PI$_1$)=CO)PO)+CC1(PI$_2$)+CC1(EMI)
CO(PI$_2$)=CO(PO)+CC1(PI$_1$)+CC1(EMI)
CO(PO)=0

So, if the output from the embedded memory arrays (EMI) is uncontrollable, then under SCOAP rules,
CC0(PO)=Min[1, 1, $\infty$]=1 Controllable
CC1(PO)=1+1+$\infty$ = $\infty$ Uncontrollable
CO(PI$_1$)=0+1+$\infty$ = $\infty$ Unobservable
CO(PI$_2$)=0+1+$\infty$ = $\infty$ Unobservable
CO(PO)=0 Observable Thus, the total number of uncontrollable nets and unobservable nets equals three. The testability measure for the AND gate is one-third.

If the output from the embedded memory arrays (EMI)) is set to the constant zero, then under SCOAP rules,
CC0(PO)=Min[1, 1, 1]=1 Controllable
CC1(PO)=1+1+$\infty$ = $\infty$ Uncontrollable
CO(PI$_1$)=0+1+$\infty$ = $\infty$ Unobservable
CO(PI$_2$)=0+1+$\infty$ = $\infty$ Unobservable
CO(PO)=0 Observable Again, the total number of uncontrollable nets and unobservable nets equals three. The testability measure for the AND gate is one-third.

If the output from the embedded memory arrays (EMI) is set to the constant one, then under Scoop rules,
CC0(PO)=Min[1, 1, $\infty$]=1 Controllable
CC1(PO)=1+1+1=3 Controllable
CO(PI$_1$)=0+1+1=2 Observable
CO(PI$_2$)=0+1+1=2 Observable
CO(PO)=0 Observable Therefore, the total number of uncontrollable nets and unobservable nets equals zero. The testability measure for the AND gate is infinity.

Thus, the testability measure of the AND gate is maximized if the embedded memory arrays output a constant one during the test mode of operation when the AND gate is tested.

Figure 5:
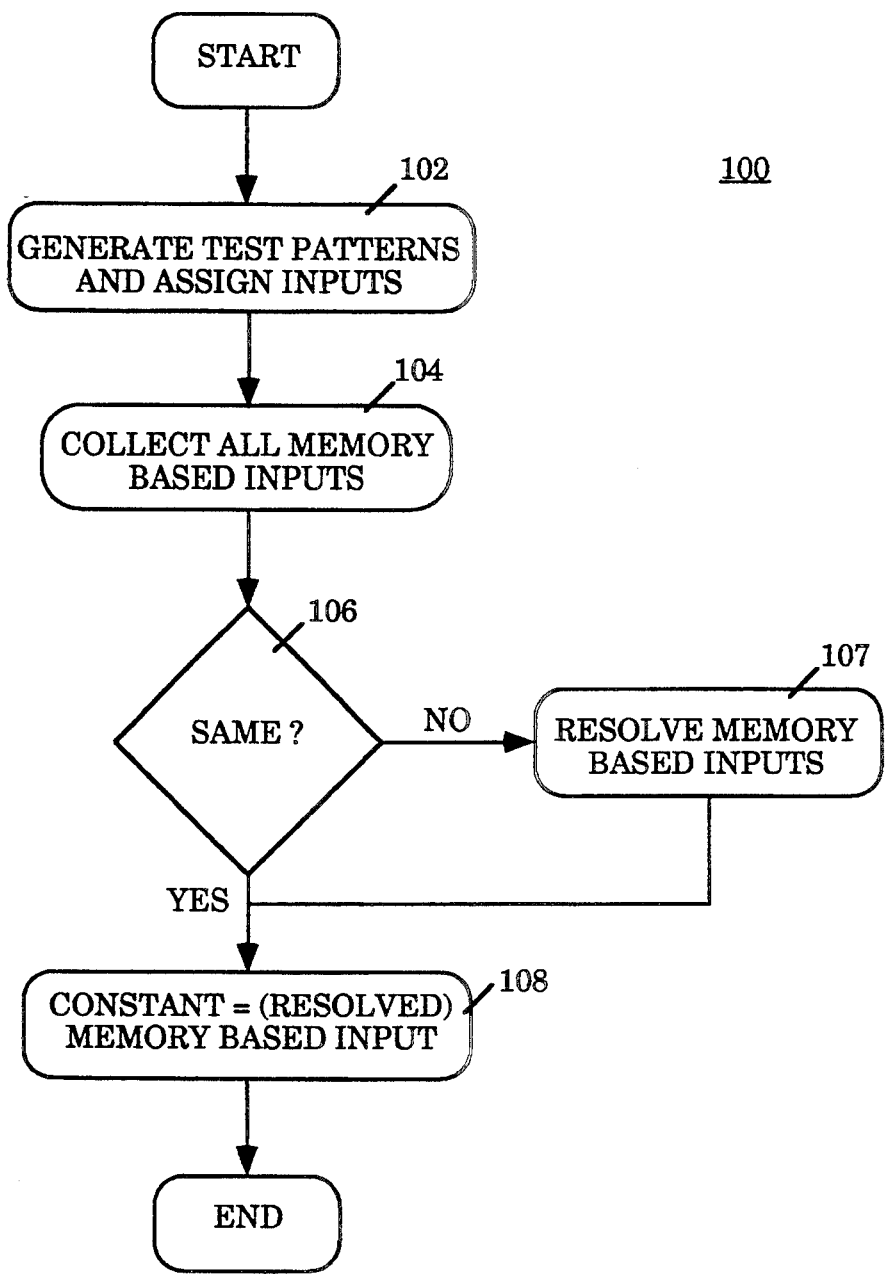
FIG. 5 shows a block diagram illustrating the second complementary method of the present invention.

Referring now to FIG. 5, a block diagram illustrating the second related method of the present invention is shown. Initially, the modified automated test patterns generation (ATPG) apparatus is used to generate test patterns and assign corresponding inputs into the system logic 102. All assigned outputs from the embedded memory arrays into the system logic are collected to derive the binary constant 104. If the assigned outputs from the embedded memory arrays into the system logic equal one another, then the fault coverage maximizing binary constant is set to equal the assigned outputs 108. If the assigned outputs from the embedded memory arrays into the system logic do not equal one another, then the binary constant is set to equal a composite output heuristically reduced from the assigned outputs from the embedded memory arrays 107 and 108. The composite output may be heuristically reduced from the assigned outputs in a variety of manners. Three alternative approaches are discussed below.

The composite output may be heuristically reduced from the assigned outputs from the embedded memory arrays using a majority approach. Under this approach, each bit of the composite output is derived as follows:
if the corresponding bits of the assigned outputs from the embedded memory arrays are equal, the bit of the composite output is set equal to the corresponding bits,
if there are more 1-bits than 0-bits in the corresponding bits of the assigned outputs from the embedded memory arrays, then the bit of the composite output is set to be equal to a 1-bit,
if there are more 0-bits than 1-bits in the corresponding bits of the assigned outputs from the embedded memory arrays, then the bit of the composite output is set to be equal to a 0-bit, if there are equal number of 1-bits and 0-bits in the corresponding bits of the assigned outputs from the embedded memory arrays, then the bit of the composite output is set to a 1-bit or a 0-bit arbitrarily.

Alternatively, the composite output may be heuristically reduced from the assigned outputs from the embedded memory arrays using a segmented majority approach, where certain assigned outputs from the embedded memory arrays are given more weight than the others. For example, the outputs that are assigned first are given more weights than the outputs that are assigned later. Under this approach, each bit of the composite output is derived as follows:

if the corresponding bits of the assigned outputs from the embedded memory arrays are equal, the bit of the composite output is set equal to the corresponding bits, if the corresponding bits of the assigned outputs from the embedded memory arrays are not equal and a weighted sum of 1-bits is greater than a weighted sum of 0-bits in the corresponding bits, then the bit of the composite output is set to be equal to a 1-bit, if the corresponding bits of the assigned outputs from the embedded memory are not equal and a weighted sum of 0-bits is greater than a weighted sum of 1-bits in the corresponding bits, then the bit of the composite output is set to be equal to a 0-bit, if the corresponding bits of the assigned outputs from the embedded memory arrays are not equal and a weighted sum of 0-bits is equal to a weighted sum of 1-bits in the corresponding bits, then the bit of the composite output is set to a 1-bit or a 0-bit arbitrarily.

As a further alternative, the composite output may be heuristically reduced from the assigned outputs from the embedded memory arrays using a marginal gain approach. Under this approach, each bit of the composite output is derived as follows:

if the corresponding bits of the assigned outputs from the embedded memory arrays are equal, the bit of the composite output is set equal to the corresponding bits, if the corresponding bits of the assigned outputs from the embedded memory arrays are not equal and marginal increase in fault coverage of the system logic with a 1-bit setting is greater than a 0-bit setting, then the bit of the composite output is set to be equal to a 1-bit, if the corresponding bits of the assigned outputs from the embedded memory arrays not equal and marginal increase in fault coverage of the system logic with a 0-bit setting is greater than a 1-bit setting, then the bit of the composite output is set to be equal to a 0-bit, if the corresponding bits of the assigned outputs from the embedded memory arrays are not equal and marginal increase in fault coverage of the system logic with a 1-bit setting is equal to a 0-bit setting, then the bit of the composite output is set to a 1-bit or a 0-bit arbitrarily.

Figure 6A:
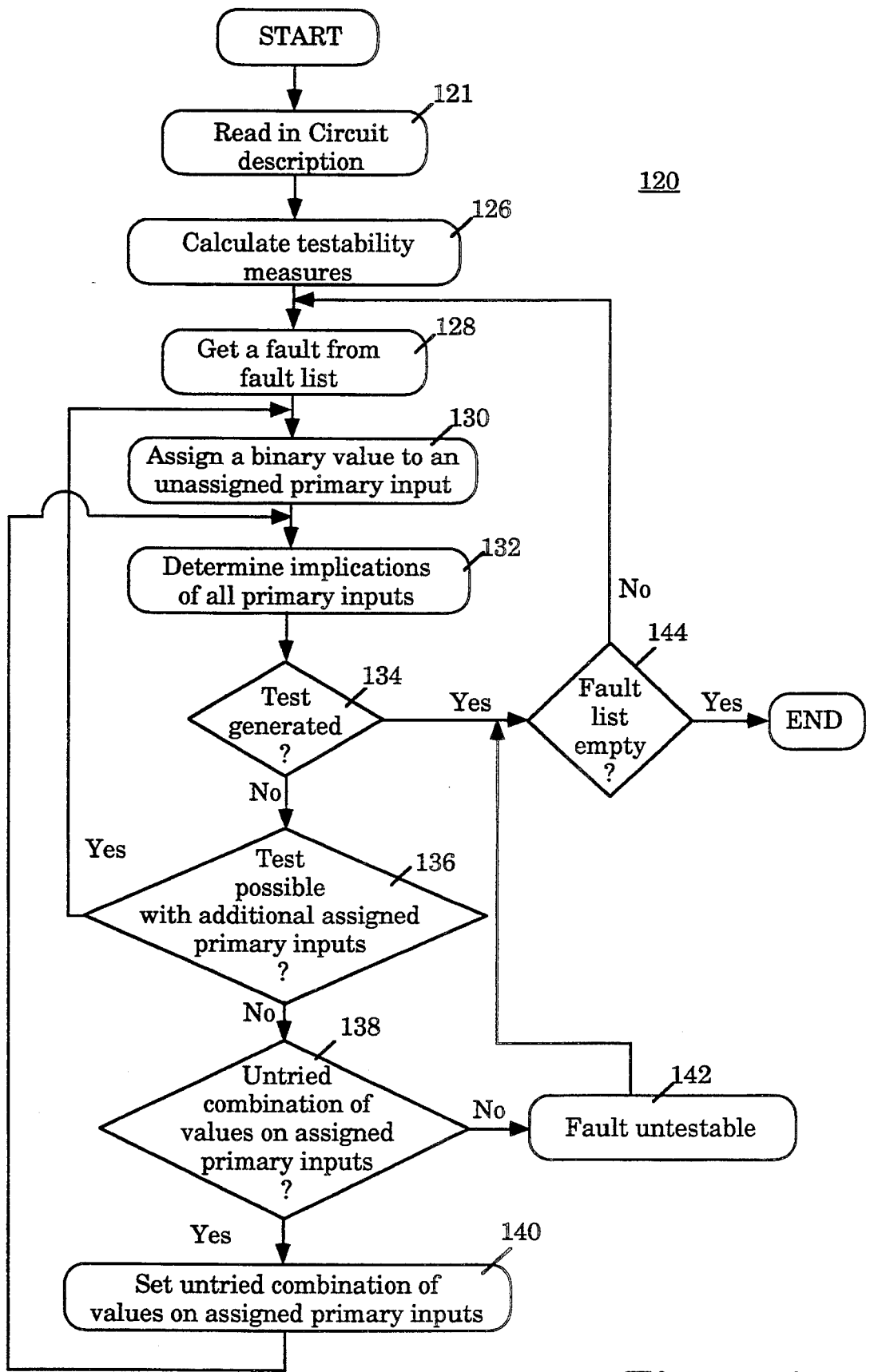
FIGS. 6a and 6b show block diagrams illustrating a typical automated test patterns generation algorithm for a standard automated test patterns generation apparatus, and the modified automated test patterns generation algorithm used by the second complementary method of the present invention.
Figure 6B:
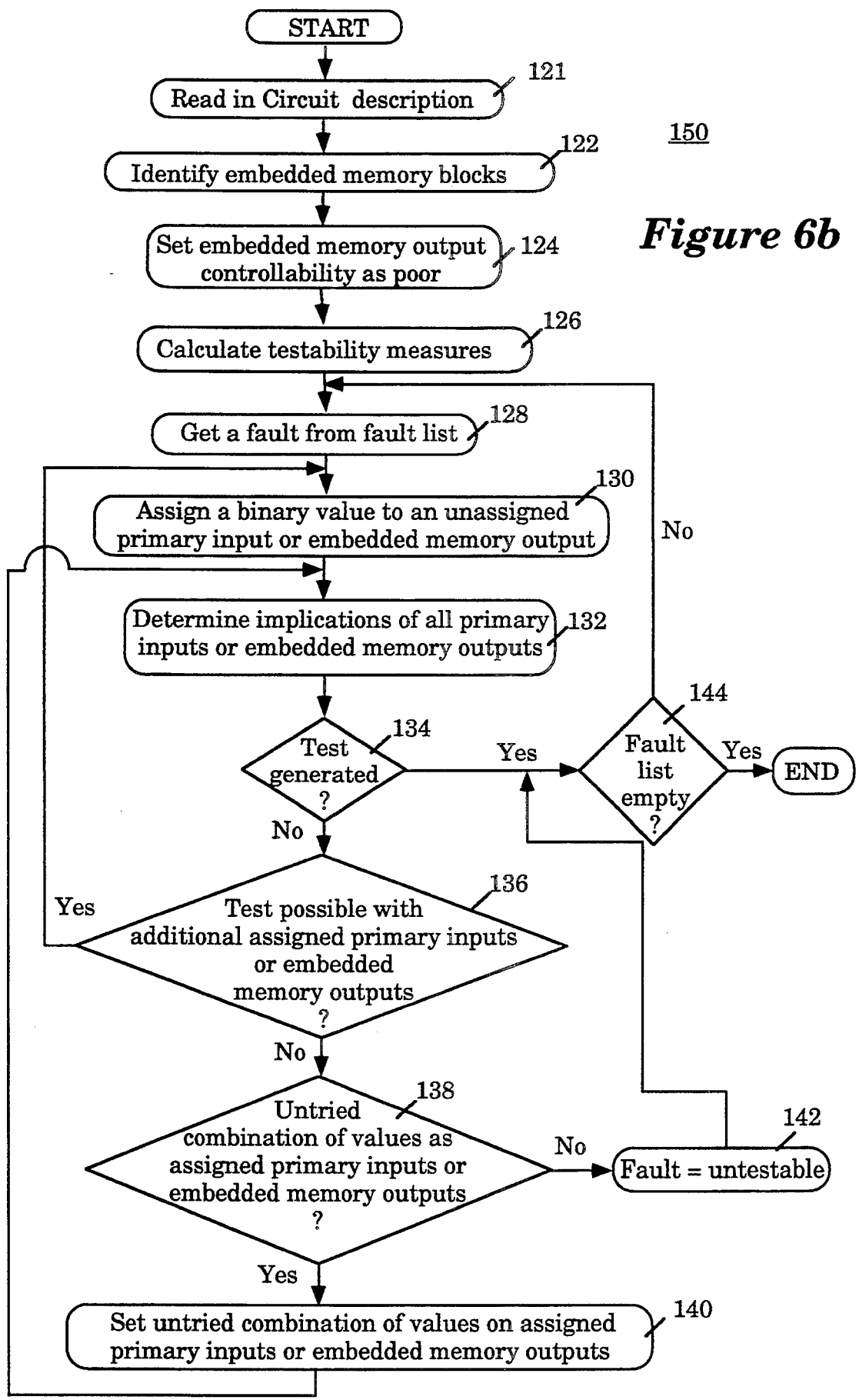

Referring now to FIGS. 6a and 6b, two block diagrams illustrating a typical automated test patterns generation (ATPG) algorithm of a standard ATPG and the modified ATPG algorithm used by the modified ATPG of the present invention are shown. Referring first to FIG. 6a, a standard ATPG algorithm typically initializes for test patterns generation by reading in a circuit description 121 and calculate various testability measures for the circuit 126. Then, a fault is retrieved from a fault list 128 for test pattern generation 130-142. The process is repeated until the fault list is empty 144.

The standard ATPG algorithm typically starts synthesizing a test pattern for a fault by assigning a binary value to one of the unassigned primary inputs of the circuit 80 based on the calculated testability measures. The standard ATPG algorithm then determines the implications of the current assignment of the primary inputs on the circuit 132. If the current assignment of the primary inputs causes the fault to be observable at one of the primary outputs, then a test pattern is successfully generated 134.

If the current assignment of primary inputs do not cause the fault to be observable at one of the primary outputs 134 and it is possible to assign a binary value to another unassigned primary input 136, the standard ATPG algorithm then repeats the steps of assignment 130 and determination 132 as previously described. If it is not possible to assign a binary value to another unassigned primary input 136, but there are untried combination of values for the assigned primary inputs 138, the standard ATPG algorithm resets the assigned primary inputs to one of the untried combination of values and repeats the step of determination 132 as previously described. If all unassigned primary inputs and combination of values of assigned primary inputs have been exhausted 136, 138, and the fault is still unobservable at one of the primary outputs, the fault is untestable 142. A description of the integrated circuit with the embedded memory arrays is provided to the standard ATPG tool.

Referring now to FIG. 6b, the ATPG tool is modified such that it is capable of identifying the embedded memory arrays from the circuit description, setting the output from the embedded memory arrays as uncontrollable during initialization for test patterns generation and including the output from the embedded memory into the system logic as assignable input into the system logic during test patterns generation.

The modified ATPG algorithm also initializes for test patterns generation by reading in a circuit description 121 and calculate various testability measures for the circuit 126. However, the modified ATPG algorithm identifies the embedded memory 122 and set the controllability of the output from the embedded memory arrays into the system logic as poor 124 before calculating the testability measures 126. Similarly, a fault is retrieved from a fault list 128 for test pattern generation 130-142, except, in addition to the primary inputs of the circuit, the outputs from the embedded memory arrays are also included for the assignment and determination process. Likewise, the process is repeated until the fault list is empty 144.

The modified ATPG algorithm starts synthesizing a test pattern for a fault by assigning a binary value to one of the unassigned primary inputs or outputs from the embedded memory arrays of the circuit 130 based on the calculated testability measures. Because, the controllability of the output from the embedded memory arrays is set to poor, the modified ATPG algorithm will tend to assign a binary value to the other unassigned primary inputs before assigning a binary value to the outputs from the embedded memory arrays. The standard ATPG algorithm then determines the implications of the current assignment of the primary inputs and the outputs from the embedded memory arrays on the circuit 132. If the current assignment of the primary inputs and the outputs from the embedded memory arrays causes the fault to be observable at one of the primary outputs, then a test pattern is successfully generated 134.

If the current assignment of primary inputs and the outputs from the embedded memory arrays do not cause the fault to be observable at one of the primary outputs 134 and it is possible to assign a binary value to another unassigned primary input or output from the embedded memory arrays 136, the modified ATPG algorithm then repeats the steps of assignment 130 and determination 132 as previously described. If it is not possible to assign a binary value to another unassigned primary input or output from the embedded memory arrays 136, but there are untried combination of values for the assigned primary inputs and outputs from the embedded memory arrays 138, the modified ATPG algorithm resets the assigned primary inputs and outputs from the embedded memory arrays to one of the untried combination of values and repeats the step of determination 132 as previously described. If all unassigned primary inputs and outputs from embedded memory arrays, and combination of values of assigned primary inputs and outputs from embedded memory have been exhausted 136, 138, and the fault is still unobservable at one of the primary outputs, the fault is untestable 142.

While the invention has been described in terms of various iterating steps to derive the binary constant to be outputted from the embedded memory arrays into the system logic using a testability measure computed for the system logic or outputs from the embedded memory arrays assigned by a modified test patterns generation tool, those skilled in the art will recognize that the invention is not limited to the iterating steps described. The method and apparatus of the present invention can be practiced with modification and alteration within the spirit and scope of the appended claims.

What is claimed is:

1. A method for deriving a binary constant to be output by embedded memory arrays into system logic of an integrated circuit for testing the system logic, said method comprising the steps of:
    generating test patterns for testing said system logic;
    assigning a set of test outputs for outputting from said embedded memory array into said system logic;
    collecting said set of assigned outputs with each of said assigned outputs comprising a plurality of assigned bits;
    synthesizing bit settings for said binary constant by heuristically reducing a composite output for outputting from said memory arrays; and
        setting said binary constant to be equal to said composite output; and
    wherein when said assigned outputs from said embedded memory arrays equal one another, said step of synthesizing bit settings for said binary constant based on said assigned outputs from said embedded memory arrays into said system logic for said generated test patterns further comprises the step of setting said binary constant to be equal to said assigned outputs.

2. A method for deriving a binary constant to be output by embedded memory arrays into system logic of an integrated circuit for testing the system logic, said method comprising the steps of:
    generating test patterns for testing said system logic;
    assigning a set of test outputs for outputting from said embedded memory array into said system logic;
    collecting said set of assigned outputs with each of said assigned outputs comprising a plurality of assigned bits;
    synthesizing bit settings for said binary constant by heuristically reducing a composite output for outputting from said memory arrays; and
        setting said binary constant to be equal to said composite output; and
    wherein said step of heuristically reducing a composite output from said embedded memory arrays comprises reducing each bit of said composite output from said embedded memory arrays heuristically from corresponding bits of said assigned outputs from said embedded memory arrays as follows
    setting said bit of said composite output from said embedded memory arrays to be equal to said corresponding bits of said assigned outputs from said embedded memory arrays if said corresponding bits of said assigned outputs from said embedded memory arrays are equal;
    setting said bit of said composite output from said embedded memory arrays to be equal to a 1-bit if there are more 1-bits than 0-bits in said corresponding bits of said assigned outputs from said embedded memory arrays;
    setting said bit of said composite output from said embedded memory arrays to be equal to a 0-bit if there are more 0-bits than 1-bits in said corresponding bits of said assigned outputs from said embedded memory arrays; and
    setting said bit of said composite output from said embedded memory arrays to be equal to said 1-bit or said 0-bit arbitrarily if there are equal number of 1-bits and 0-bits in said corresponding bits of said assigned outputs from said embedded memory arrays.

3. A method for deriving a binary constant to be output by embedded memory arrays into system logic of an integrated circuit for testing the system logic, said method comprising the steps of:
    generating test patterns for testing said system logic;
    assigning a set of test outputs for outputting from said embedded memory array into said system logic;
    collecting said set of assigned outputs with each of said assigned outputs comprising a plurality of assigned bits;
    synthesizing bit settings for said binary constant by heuristically reducing a composite output from said assigned outputs from said embedded memory arrays; and
        setting said binary constant to be equal to said composite output; and
    wherein said step of heuristically reducing a composite output from said embedded memory arrays comprises reducing each bit of said composite output from said embedded memory arrays heuristically from corresponding bits of said assigned outputs from said embedded memory arrays as follows
    setting said bit of said composite output from said embedded memory arrays to be equal to said corresponding bits of said assigned outputs from said embedded memory arrays if said corresponding bits of said assigned outputs from said embedded memory arrays are equal;
    setting said bit of said composite output from said embedded memory arrays to be equal to a 1-bit if said corresponding bits of said assigned outputs from said embedded memory arrays are not equal and a weighted sum of 1-bits is greater than a weighted sum of 0-bits in said corresponding bits of said assigned outputs from said embedded memory arrays;

setting said bit of said composite output from said embedded memory arrays to be equal to a 0-bit if said corresponding bits of said assigned outputs from said embedded memory arrays are not equal and said weighted sum of 0-bits is greater than said weighted sum of 1-bits in said corresponding bits of said assigned outputs from said embedded memory arrays; and setting said bit of said composite output from said embedded memory arrays to be equal to said 1-bit or said 0-bit arbitrarily if said corresponding bits of said assigned outputs from said embedded memory arrays are not equal and said weighted sum of 1-bits is equal to said weighted sum of 0-bits in said corresponding bits of said assigned outputs from said embedded memory arrays.

4. A method for deriving a binary constant to be output by embedded memory arrays into system logic of an integrated circuit for testing the system logic, said method comprising the steps of:

generating test patterns for testing said system logic;

assigning a set of test outputs for outputting from said embedded memory array into said system logic;

collecting said set of assigned outputs with each of said assigned outputs comprising a plurality of assigned bits;

synthesizing bit settings for said binary constant by
heuristically reducing a composite output from said assigned outputs from said embedded memory arrays; and
setting said binary constant to be equal to said composite output; and wherein said step of heuristically reducing a composite output from said embedded memory arrays comprises reducing each bit of said composite output from said embedded memory arrays heuristically from corresponding bits of said assigned outputs from said embedded memory arrays as follows setting said bit of said composite output from said embedded memory arrays to be equal to said corresponding bits of said assigned outputs from said embedded memory arrays if said corresponding bits of said assigned outputs from said embedded memory arrays are equal;

setting said bit of said composite output from said embedded memory arrays to be equal to a 1-bit if said corresponding bits of said assigned outputs from said embedded memory arrays are not equal and marginal increase in fault coverage of said system logic is greater with said 1-bit setting than a 0-bit setting;

setting said bit of said composite output from said embedded memory arrays to be equal to a 0-bit if said corresponding bits of said assigned outputs from said embedded memory arrays are not equal and marginal increase in fault coverage of said system logic is greater with said 0-bit setting than said 1-bit setting; and setting said bit of said composite output from said embedded memory arrays to be equal to said 1-bit or said 0-bit arbitrarily if said corresponding bits of said assigned outputs from said embedded memory arrays are not equal and marginal increases in fault coverage of said system logic with said 1-bit setting and said 0-bit setting are equal.

5. An apparatus for deriving a binary constant to be output by embedded memory arrays into system logic of an integrated circuit for testing the system logic, said apparatus comprising:

generating means for generating test patterns for testing said system logic;

means for assigning a set of test outputs for outputting from said embedded memory array into said system logic;

means for collecting said set of assigned outputs, with each of said assigned outputs comprising a plurality of assigned bits;

synthesizing means for synthesizing bit settings for said binary constant by
heuristically reducing a composite output for outputting from said memory arrays; and
means for setting said binary constant to be equal to said composite output; and wherein said synthesizing means receives said assigned outputs from said embedded memory arrays as inputs from said generating means.

6. An apparatus for deriving a binary constant to be output by embedded memory arrays into system logic of an integrated circuit for testing the system logic, said apparatus comprising:

generating means for generating test patterns for testing said system logic;

means for assigning a set of test outputs for outputting from said embedded memory array into said system logic;

means for collecting said set of assigned outputs, with each of said assigned outputs comprising a plurality of assigned bits;

synthesizing means for synthesizing bit settings for said binary constant by
heuristically reducing a composite output for outputting from said memory arrays; and
means for setting said binary constant to be equal to said composite output; and wherein said synthesizing means reduces a composite output from said embedded memory arrays heuristically from said assigned outputs from said embedded memory arrays by reducing each bit of said composite output from said embedded memory arrays heuristically from corresponding bits of said assigned outputs from said embedded memory arrays as follows setting said bit of said composite output from said embedded memory arrays to be equal to said corresponding bits of said assigned outputs from said embedded memory arrays if said corresponding bits of said assigned outputs from said embedded memory arrays are equal;

setting said bit of said composite output from said embedded memory arrays to be equal to a 1-bit if there are more 1-bits than 0-bits in said corresponding bits of said assigned outputs from said embedded memory arrays;

setting said bit of said composite output from said embedded memory arrays to be equal to a 0-bit if there are more 0bits than 1-bits in said corresponding bits of said assigned outputs from said embedded memory arrays; and setting said bit of said composite output from said embedded memory arrays to be equal to said 1-bit or said 0-bit arbitrarily if there are equal number of 1-bits and 0-bits in said corresponding bits of said assigned outputs from said embedded memory arrays.

7. An apparatus for deriving a binary constant to be output by embedded memory arrays into system logic of an integrated circuit for testing the system logic, said apparatus comprising:

generating means for generating test patterns for testing said system logic;

means for assigning a set of test outputs for outputting from said embedded memory array into said system logic;

means for collecting said set of assigned outputs, with each of said assigned outputs comprising a plurality of assigned bits;

synthesizing means for synthesizing bit settings for said binary constant by heuristically reducing a composite output for outputting from said memory arrays; and means for setting said binary constant to be equal to said composite output; and wherein said synthesizing means reduces a composite output from said embedded memory arrays heuristically from said assigned outputs from said embedded memory arrays by reducing each bit of said composite output from said embedded memory arrays heuristically from corresponding bits of said assigned outputs from said embedded memory arrays as follows setting said bit of said composite output from said embedded memory arrays to be equal to said corresponding bits of said assigned outputs from said embedded memory arrays if said corresponding bits of said assigned outputs from said embedded memory arrays are equal;

setting said bit of said composite output from said embedded memory arrays to be equal to a 1-bit if said corresponding bits of said assigned outputs from said embedded memory arrays are not equal and a weighted sum of 1-bits is greater than a weighted sum of 0-bits in said corresponding bits of said assigned outputs from said embedded memory arrays;

setting said bit of said composite output from said embedded memory arrays to be equal to a 0-bit if said corresponding bits of said assigned outputs from said embedded memory arrays are not equal and said weighted sum of 0-bits is greater than said weighted sum of 1-bits in said corresponding bits of said assigned outputs from said embedded memory arrays; and setting said bit of said composite output from said embedded memory arrays to be equal to said 1-bit or said 0-bit arbitrarily if said corresponding bits of said assigned outputs from said embedded memory arrays are not equal and said weighted sum of 1-bits is equal to said weighted sum of 0-bits in said corresponding bits of said assigned outputs from said embedded memory arrays.

8. An apparatus for deriving a binary constant to be output by embedded memory arrays into system logic of an integrated circuit for testing the system logic, said apparatus comprising:

generating means for generating test patterns for testing said system logic;

means for assigning a set of test outputs for outputting from said embedded memory array into said system logic;

means for collecting said set of assigned outputs, with each of said assigned outputs comprising a plurality of assigned bits;

synthesizing means for synthesizing bit settings for said binary constant by heuristically reducing a composite output for outputting from said memory arrays; and means for setting said binary constant to be equal to said composite output;

wherein said synthesizing means reduces a composite output from said embedded memory arrays heuristically from said assigned outputs from said embedded memory arrays by reducing each bit of said composite output from said embedded memory arrays heuristically from corresponding bits of said assigned outputs from said embedded memory arrays as follows:

setting said bit of said composite output from said embedded memory arrays to be equal to said corresponding bits of said assigned outputs from said embedded memory arrays if said corresponding bits of said assigned outputs from said embedded memory arrays are equal;

setting said bit of said composite output from said embedded memory arrays to be equal to a 1-bit if said corresponding bits of said assigned outputs from said embedded memory arrays are not equal and marginal increase in fault coverage of said system logic is greater with said 1-bit setting than a 0-bit setting;

setting said bit of said composite output from said embedded memory arrays to be equal to a 0-bit if said corresponding bits of said assigned outputs from said embedded memory arrays are not equal and marginal increase in fault coverage of said system logic is greater with said 0-bit setting than said 1-bit setting; and setting said bit of said composite output from said embedded memory arrays to be equal to said 1-bit or said 0-bits in said corresponding bits of said assigned outputs from said embedded memory arrays are not equal and marginal increases in fault coverage of said system logic with said 1-bit setting and said 0-bit setting are equal.

9. A method for deriving a binary constant for use in testing system logic of an integrated circuit, said method comprising the steps of:

generating test patterns for testing said system logic;

determining a set of test inputs to said system logic corresponding to said test patterns, each of said inputs including a plurality of bits;

deriving a composite input having a plurality of bits from said set of inputs by heuristically reducing each of said bits of said composite input from corresponding bits of said test inputs by a) selecting a bit to be set of said composite input;

b) setting said bit of said composite input to be equal to corresponding bits of said test inputs, if said corresponding bits of said assigned inputs are equal;

c) setting said bit of said composite input to be equal to a 1-bit, if there are more 1-bits than 0-bits in corresponding bits of said test inputs;

d) setting said bit of said composite input to be equal to a 0-bit, if there are more 0-bits than 1-bits in corresponding bits of said test inputs;

e) setting said bit of said composite output to be equal to said 1-bit or said 0-bit arbitrarily, if there are equal numbers of 1-bits and 0-bits in corresponding bits of said test inputs; and f) repeating steps b) through e) for all remaining bits to be set within said composite input; and setting said binary constant to be equal to said composite input.

10. A method for deriving a binary constant for use in testing system logic of an integrated circuit, said method comprising the steps of:

generating test patterns for testing said system logic;

determining a set of test inputs to said system logic corresponding to said test patterns, each of said inputs including a plurality of bits;

deriving a composite input having a plurality of bits from said set of inputs by heuristically reducing each of said bits of said composite input from corresponding bits of said test inputs by a) selecting a bit to be set of said composite input;

b) setting said bit of said composite input to be equal to corresponding bits of said test inputs, if said corresponding bits of said assigned inputs are equal;

c) setting said bit of said composite output to be equal to a 1-bit, if corresponding bits of said test inputs arrays are not equal and a weighted sum of 1-bits is greater than a weighted sum of 0-bits in said corresponding bits of said test inputs;

d) setting said bit of said composite output to be equal to a 0-bit, if corresponding bits of said test inputs are not equal and a weighted sum of 0-bits is greater than a weighted sum of 1-bits in said corresponding bits of said test inputs;

e) setting said bit of said composite output to be equal to said 1-bit or said 0-bit arbitrarily, if said corresponding bits of said test inputs are not equal and a weighted sum of 1-bits is equal to a weighted sum of 0-bits in said corresponding bits of said test inputs; and f) repeating steps b) through e) for all remaining bits to be set within said composite input; and setting said binary constant to be equal to said composite input.

11. A method for deriving a binary constant for use in testing system logic of an integrated circuit, said method comprising the steps of:

generating test patterns for testing said system logic;

determining a set of test inputs to said system logic corresponding to said test patterns, each of said inputs including a plurality of bits;

deriving a composite input having a plurality of bits from said set of inputs by heuristically reducing each of said bits of said composite input from corresponding bits of said test inputs by a) selecting a bit to be set of said composite input;

b) setting said bit of said composite input to be equal to corresponding bits of said test inputs, if said corresponding bits of said assigned inputs are equal;

c) setting said bit of said composite output to be equal to a 1-bit, if corresponding bits of said test inputs are not equal and marginal increase in fault coverage of said system logic is greater with a 1-bit setting than with said 0-bit setting;

d) setting said bit of said composite output to be equal to a 0-bit, if corresponding bits of said test inputs are not equal and marginal increase in fault coverage of said system logic is greater with a 0-bit setting than with said 1-bit setting;

e) setting said bit of said composite output to be equal to said 1-bit or said 0-bit arbitrarily, if corresponding bits of said test input are not equal and a marginal increase in fault coverage of said system logic with said 1-bit setting and with said 0-bit setting are equal; and f) repeating steps b) through e) for all remaining bits to be set within said composite input; and setting said binary constant to be equal to said composite input.

12. An apparatus for deriving a binary constant for use in testing system logic of an integrated circuit, said apparatus comprising:

an element for generating test patterns for testing said system logic;

an element for determining a set of test inputs to said system logic corresponding to said test patterns, each of said inputs including a plurality of bits;

an element for deriving a composite input having a plurality of bits from said set of inputs by heuristically reducing each of said bits of said composite input from corresponding bits of said test inputs, wherein said element for deriving a composite input includes an element for performing the operations of a) selecting a bit to be set of said composite input;

b) setting said bit of said composite input to be equal to corresponding bits of said test inputs, if said corresponding bits of said assigned inputs are equal;

c) setting said it of said composite input to be equal to a 1-bit, if there are more 1-bits than 0-bits in corresponding bits of said test inputs;

d) setting said bit of said composite input to be equal to a 0-bit, if there are more 0-bits than 1-bits in corresponding bits of said test inputs;

e) setting said bit of said composite output to be equal to said 1-bit or said 0-bit arbitrarily, if there are equal numbers of 1-bits and 0-bits in corresponding bits of said test inputs; and f) repeating operations b) through e) for all remaining bits to be set within said composite input; and an element for setting said binary constant to be equal to said composite input; and 13. An apparatus for deriving a binary constant for use in testing system logic of an integrated circuit, said apparatus comprising:

an element for generating test patterns for testing said system logic;

an element for determining a set of test inputs to said system logic corresponding to said test patterns, each of said inputs including a plurality of bits;

an element for deriving a composite input having a plurality of bits from said set of inputs by heuristically reducing each of said bits of said composite input from corresponding bits of said test inputs, wherein said element for deriving a composite input includes an element for performing the operations of a) selecting a bit to be set of said composite input;

b) setting said bit of said composite input to be equal to corresponding bits of said test inputs, if said corresponding bits of said assigned inputs are equal;

c) setting said bit of said composite output to be equal to a 1-bit, if corresponding bits of said test inputs arrays are not equal and a weighted sum of 1-bit is greater than a weighted sum of 0-bits in said corresponding bits of said test inputs;

d) setting said bit of said composite output to be equal to a 0-bit, if corresponding bits of said test inputs are not equal and a weighted sum of 0-bits is greater than a weighted sum of 1-bits in said corresponding bits of said test inputs;

e) setting said bit of said composite output to be equal to said 1-bit or said 0-bit arbitrarily, if said corresponding bits of said test inputs are not equal and a weighted sum of 1-bits is equal to a weighted sum of 0-bits n said corresponding bits of said test inputs; and f) repeating operations b) through e) for all remaining bits to be set within said composite input; and an element for setting said binary constant to be equal to said composite input.

14. An apparatus for deriving a binary constant for use in testing system logic of an integrated circuit, said apparatus comprising:

an element for generating test patterns for testing said system logic;

an element for determining a set of test inputs to said system logic corresponding to said test patterns, each of said inputs including a plurality of bits;

an element for deriving a composite input having a plurality of bits from said set of inputs by heuristically reducing each of said bits of said composite input from corresponding bits of said test inputs, wherein said element for deriving a composite input includes an element for performing the operations of a) selecting a bit to be set of said composite input;

b) setting said bit of said composite input to be equal to corresponding bits of said test inputs, if said corresponding bits of said assigned inputs are equal;

c) setting said bit of said composite output to be equal to a 1-bit, if corresponding bits of said test inputs are not equal and marginal increase in fault coverage of said system logic is greater with a 1-bit setting than with a 0-bit setting;

d) setting said bit of said composite output to be equal to a 0-bit setting; if corresponding bits of said test inputs are not equal and a marginal increase in fault coverage of said system logic is greater with said 0-bit setting that with said 1-bit setting;

e) setting said bit of said composite output to be equal to said 1-bit or said 0-bit arbitrarily, if corresponding bits of said test input are not equal and a marginal increase in fault coverage of said system logic with said 1-bit setting and with said 0-bit setting are equal; and f) repeating operations b) through e) for all remaining bits to be set within said composite input; and an element for setting said binary constant to be equal to said composite input.

15. A method for deriving a binary constant for use in testing system logic of an integrated circuit, with the system logic including a plurality of nets, a portion of which are uncontrollable and a portion of which are unobservable for any given binary constant input to the system logic, said method comprising the steps of:

selecting a testability measure for said system logic, said testability measure being representative of an inverse of a total number of uncontrollable nets union unobservable nets within the system logic for a given binary constant; and determining bit settings for a binary constant which maximize the testability measure by a) setting said binary constant to a default value;

b) evaluating the testability measure for the binary constant;

c) selectively modifying said binary constant; and d) repeating steps b)–c) until the testability measure is maximized.

16. The method of claim 15, wherein said binary constant is provided by an embedded memory into said system logic and wherein said step of determining bit settings for said binary constant comprises the step of:

setting all bits of an assumed output from said embedded memory arrays into said system logic to be uncontrollable;

setting a global maximum and a current maximum of a testability measure for said system logic to be equal to said testability measure computed with said assumed output from said embedded memory arrays; and setting said binary constant to be equal to said assumed output from said embedded memory arrays.

17. The method of claim 15, wherein said step of determining bit settings for said binary constant further comprises repeating, for each individual bit of said binary constant, the steps of:

resetting a corresponding bit of said assumed output from said embedded memory arrays into said system logic to be controllable to a binary value of 0;

resetting said current maximum of said testability measure for said system logic to be equal to said testability measure computed with said reset assumed output from said embedded memory arrays;

resetting said bit of said binary constant to be equal to said corresponding bit of said reset assumed output from said embedded memory arrays if said reset current maximum is greater than said global maximum; and resetting said global maximum to said reset current maximum if said bit of said binary constant is reset.

18. The method of claim 16, wherein said step of determining bit settings for said binary constant further comprises the steps of:

resetting said corresponding bit of said assumed output from said embedded memory arrays into said system logic to be controllable to a binary value of 1;

repeating said steps of resetting said current maximum of said testability measure, conditionally resetting said bit of said binary constant and conditionally resetting said global maximum; and resetting said assumed output from said embedded memory arrays into said system logic to be equal to said binary constant.

19. An apparatus for deriving a binary constant for use in testing system logic of an integrated circuit, with the system logic including a plurality of nets, a portion of which are uncontrollable and a portion of which are unobservable for any given binary constant input to the system logic, said apparatus comprising:

an element for selecting a testability measure for said system logic, said testability measure being representative of an inverse of a total number of uncontrollable nets union unobservable nets within the system logic for a given binary constant; and an element for determining bit settings for a binary constant which maximize the testability measure by setting said binary constant to a default value;

evaluating the testability measure for the binary constant; and selectively modifying said binary constant until the testability measure is maximized.

20. The apparatus of claim 19, wherein said apparatus includes an embedded memory connected to said system logic, said embedded memory array providing said binary constant to said system logic, and wherein said element for determining bit settings for said binary constant operates by:

setting all bits of an assumed output from said embedded memory arrays into said system logic to be uncontrollable;

setting a global maximum and a current maximum of a testability measure for said system logic to be equal to said testability measure computed with said assumed output from said embedded memory arrays; and setting said binary constant to be equal to said assumed output from said embedded memory arrays.

21. The apparatus of claim 20, wherein said element for determining bit settings for said binary constant further comprises an element for repeating, for each individual bit of said binary constant, the operations of:

resetting a corresponding bit of said assumed output from said embedded memory arrays into said system logic to be controllable to a binary value of 0;

resetting said current maximum of said testability measure for said system logic to be equal to said testability measure computed with said reset assumed output from said embedded memory arrays;

resetting said bit of said binary constant to be equal to said corresponding bit of said reset assumed output from said embedded memory arrays if said reset current maximum is greater than said global maximum; and resetting said global maximum to said reset current maximum if said bit of said binary constant is reset.

22. The apparatus of claim 21, wherein said element for determining bit settings for said binary constant further comprises an element for performing the operations of:

resetting said corresponding bit of said assumed output from said embedded memory arrays into said system logic to be controllable to a binary value of 1;

repeating said steps of resetting said current maximum of said testability measure, conditionally resetting said bit of said binary constant and conditionally resetting said global maximum; and resetting said assumed output from said embedded memory arrays into said system logic to be equal to said binary constant.

23. A method for deriving a binary constant to be output by embedded memory arrays into system logic of an integrated circuit for use in testing the system logic, with the system logic including a plurality of nets, a portion of which are uncontrollable and a portion of which are unobservable for any given binary constant input to the system logic, said method comprising the steps of:

selecting a testability measure for said system logic, said testability measure being representative of an inverse of a total number of uncontrollable nets union unobservable nets within the system logic for a given binary constant;

selecting bit settings for said binary constant that maximize said testability measure by setting all bits of an assumed output from said embedded memory arrays into said system logic to be uncontrollable;

setting a global maximum and a current maximum of a testability measure for said system logic to be equal to said testability measure computed with said assumed output from said embedded memory arrays; and setting said binary constant to be equal to said assumed output from said embedded memory arrays.

24. The method of claim 23, wherein said step of selecting bit settings for said binary constant the maximize said testability measure further comprises a plurality of steps to determine a setting for a bit of said binary constant, with said plurality of steps of being repeated for each bit of said binary constant.

25. The method of claim 24, wherein said steps to determine a setting for a bit of said binary constant comprise the steps of:

resetting a corresponding bit of said assumed output from said embedded memory arrays into said system logic to be controllable to a binary value of 0;

resetting said current maximum of said testability measure for said system logic to be equal to said testability measure computed with said reset assumed output from said embedded memory arrays;

resetting said bit of said binary constant to be equal to said corresponding bit of said reset assumed output from said embedded memory arrays if said reset current maximum is greater than said global maximum;

resetting said global maximum to said reset current maximum if said bit of said binary constant is reset.

26. The method of claim 25, wherein said steps to determine a setting for a bit of said binary constant further comprise the steps of:

resetting said corresponding bit of said assumed output from said embedded memory arrays into said system logic to be controllable to a binary value of 1;

repeating said steps of resetting said current maximum of said testability measure, conditionally resetting said bit of said binary constant and conditionally resetting said global maximum; and resetting said assumed output from said embedded memory arrays into said system logic to be equal to said binary constant.

* * * * *

UNITED STATES PATENT AND TRADEMARK OFFICE
CERTIFICATE OF CORRECTION

PATENT NO. : 5,379,303
DATED : January 3, 1995
INVENTOR(S) : Levitt

It is certified that error appears in the above-identified patent and that said Letters Patent is hereby corrected as shown below:

In column 20, claim 17, please delete " 15 " and insert -- 16 --.

In column 20, claim 18, please delete " 16 " and insert -- 17 --.

Signed and Sealed this

Eighth Day of June, 1999

Attest:

Q. TODD DICKINSON

*Attesting Officer*

*Acting Commissioner of Patents and Trademarks*